United States Patent [19]

De Andrea

[11] Patent Number: 5,590,938
[45] Date of Patent: Jan. 7, 1997

[54] COMPUTER FRAME OF RIVETED MODULAR CONSTRUCTION

[75] Inventor: Renato De Andrea, Milan, Italy

[73] Assignee: Bull HN Information Systems Italia S.P.A., Caluso-Turin, Italy

[21] Appl. No.: 409,186

[22] Filed: Mar. 23, 1995

[30] Foreign Application Priority Data

May 30, 1994 [EP] European Pat. Off. ............ 94830262

[51] Int. Cl.⁶ ............................. A47B 43/00; H05K 4/18
[52] U.S. Cl. .................... 312/257.1; 312/249.8; 312/236; 312/265.5; 312/351.11; 439/61; 361/797
[58] Field of Search ................... 312/213, 108, 312/257.1, 265.1, 265.2, 265.6, 265.5, 249.8, 223.2, 351.11; 361/730, 736, 784, 788, 796, 797, 799, 800, 803, 816, 818; 439/59, 55, 61; 174/35 R

[56] References Cited

U.S. PATENT DOCUMENTS

| | | | |
|---|---|---|---|
| 2,115,720 | 5/1938 | Holmes | 312/236 X |
| 3,271,626 | 9/1966 | Howrilka | 361/797 X |
| 3,915,307 | 10/1975 | Agarde | 439/61 X |
| 4,102,554 | 7/1978 | Reimer | 312/265.5 X |
| 4,277,120 | 7/1981 | Drake et al. | 361/797 X |
| 4,728,160 | 3/1988 | Mondor et al. | 312/257.1 X |

FOREIGN PATENT DOCUMENTS

| | | |
|---|---|---|
| 238221 | 9/1987 | European Pat. Off. . |
| 438014 | 7/1991 | European Pat. Off. . |
| 3601943 | 7/1987 | Germany . |
| 3737905 | 5/1989 | Germany ................ 439/61 |

*Primary Examiner*—Peter M. Cuomo
*Assistant Examiner*—James O. Hansen
*Attorney, Agent, or Firm*—Rosen, Dainow & Jacobs, L.L.P.

[57] ABSTRACT

A computer frame of riveted modular construction, formed by a plurality of essentially flat structural members provided with stiffening ribs which members are formed from zinc plated sheet metal and only joined together by riveting following an additional step of fully zinc plating the individual members, with no need for any further protective and finishing treatments.

7 Claims, 4 Drawing Sheets

COMPUTER FRAME OF RIVETED MODULAR CONSTRUCTION

DESCRIPTION

1. Field of the Invention

The present invention relates to a computer frame of fully riveted modular construction.

It is known that computers comprise a plurality of electric and electronic apparatus, such as printed circuit boards, magnetic disc or tape drives, power supply devices, keyboard controls, ventilation devices and connectors, which must be accommodated on a mechanical frame and guarded against shock and strain.

The frame is to meet a range of different requirements:

it ought to be mechanically strong and stiff, to guard the electronic components and ensure that shocks and accelerations from improper handling would be damped;

it ought to provide for easy installation and removal of the various apparatus, for convenience in servicing and configuring the system;

it ought to provide for effective and properly distributed ventilation of the apparatus;

it ought to screen the apparatus electromagnetically from external electromagnetic influence and attenuate the emission of any disturbance caused by the apparatus;

it ought to provide an effective electric ground with no potential differences between different parts;

it ought to be unaffected by weather and mechanical ageing;

it ought to be readily manufactured by low-cost processes and through the shortest possible processing cycles;

it should be inexpensive, have an elegant appearance and limited weight for ease of transport.

It is extremely difficult to meet all these requirements at once.

2. State of Art

For small computers, essentially of the portable type, plastics packages have been provided which meet several of these requirements, but cannot be used with larger size computers.

For larger size computers, structures have been generally adopted which are formed of metal members, plates and sectional members, welded together and then painted and/or zinc plated to conceal the weld burns and protect the frame against corrosion, using time-comsuming and expensive manufacturing processes which require roomy processing and storage facilities for the products being processed and the finished products, and keep such facilities engaged for a significant length of time.

The processing plants, such as as the zinc plating bath, or more generally the passivating (cadmium plating, anodizing, etc.) baths, the painting chambers, and baking furnaces, also must have ample dimensions, which results in high running costs.

For ventilation purposes, open bottom structures have been used which, accordingly, are raised off the floor for drawing in a ventilation flow stream from below, and provided with grid-covered openings located at upward or forward/rearward elevated positions to exhaust the ventilation flow stream, thereby creating objectionable blow-offs which can be felt by nearby operators and inlets for foreign matter to fall by gravity therethrough and possibly damage the apparatus.

To provide an effective electric ground, painting techniques had to be combined with zinc plating processes to ensure effective contact of the ground conductors with the metal parts.

To combine structural stiffness with a capability to absorb shocks, particularly from dropping, supporting feet have been used which are attached to the structure with the intermediary of elastic damping pads whose cost and volume is more than negligible.

To provide for convenient access to the components, rear, and occasionally front and rear, accessed frames have been used.

As for low-cost manufacture, no significant steps forward have been made, except in the portable computer field by the adoption of plastics containers to act as frames.

SUMMARY OF THE INVENTION

The present invention is directed to provide a computer frame which can meet all of the requirements outlined above, and overcome the aforementioned limitations and drawbacks.

According to one aspect of the present invention, these results are secured by a computer frame which is made up of mutually joined modular members, basically in the form of flat metal panels having raised strengthening ribs formed by bending and being riveted together.

These panels, which are blanked off zinc plated or otherwise passivated ferrous sheet metal and provided as by punching with all the necessary openings and reliefs, including the rivet eyelets, by having minimal volume can be later subjected to full zinc plating in zinc plating vats of reduced size for protecting all the blanked surfaces against oxidation or chemical attack, while ensuring full electric conduction throughout the surface.

The panels thus processed can be easily handled and stored for subsequent assembling into frames, to be carried out by riveting over a minimal assembly time.

The frames thus assembled will require no finishing and be ready for installation of the electronic apparatus.

The structure aimed at can be assembled from few modular members, namely a bottom panel, two side panels and a top panel.

According to another aspect of the present invention, the bottom panel, which is to bear the weight of the whole structure, is strengthened by a pair of panels, each bent into a stiffening crosspiece which will, when joined to the bottom panel, form a strong rigid box-type member whereto rest feet are attached by freely passing through openings in the bottom panel and securing them to the stiffening crosspieces, thereby providing a leaf spring suspension for the frame which ensures effective damping of shocks and vibration without involving the use of any additional resilient damping elements.

According to a further aspect of the present invention, the bottom panel has a raised stiffening rim formation provided with intake openings for a ventilation stream to be uniformly distributed throughout the interior volume of the frame, from all around the bottom panel periphery, and discharged through openings and reliefs provided in the upper ends of the frame side panels.

According to a further aspect of the present invention, the top panel has a large window which, without impairing the structure stiffness, allows electronic components to be passed in and out and inspected through the frame top, additionally to the freedom of access afforded by the open front and rear of the frame.

According to a further aspect of the present invention, the frame is provided with backing side panels of metal suspended to the frame and being easily removed, which panels bear on ribs or ribbings of the side panels and are attached to the latter by webs of a pile velvet known by the trade name VELCRO (registered trademark).

These panels are painted on the outside and zinc plated on the inside, and meet the aesthetic requirements while adding to the electromagnetic screening provided by the frame in co-operation with a removable metal cover overlying the top panel of the frame.

In addition, they define with the metal cover a downward pointing flow-through port for the ventilation stream which diverts the ventilation stream toward the frame sides, thereby ensuring, on the one side, that no foreign matter can inadvertently enter the frame housing, and on the other, that the flowing ventilation stream cannot trouble the operator.

BRIEF DESCRIPTION OF THE DRAWINGS

The features and advantages of the present invention will be more clearly apparent from the following description of a preferred embodiment thereof and from the accompanying drawings, in which.

DESCRIPTION OF A PREFERRED EMBODIMENT

Figure 1:
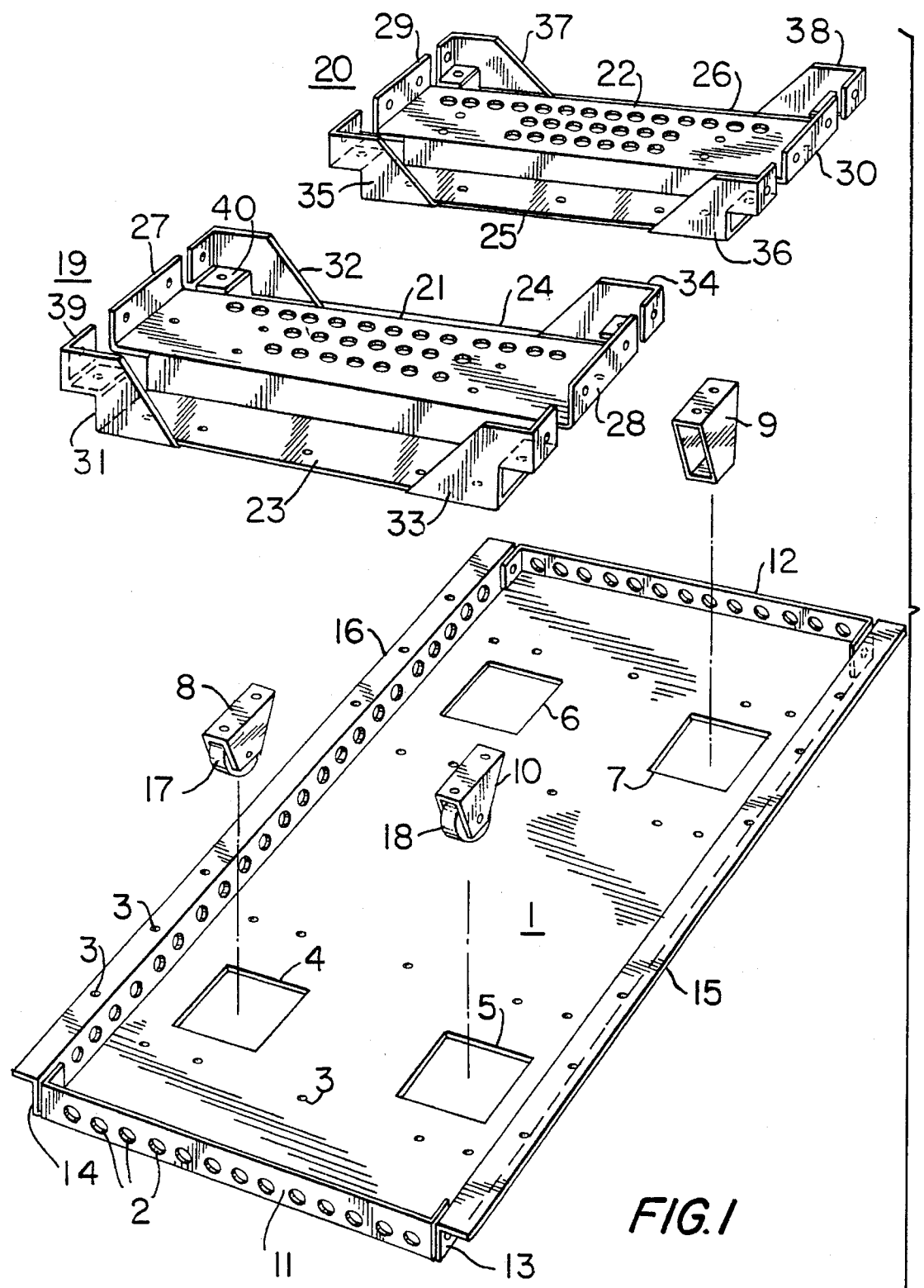
FIG. 1 is an exploded perspective view showing a preferred embodiment of the bottom panel, the strengthening crosspieces and the supporting feet for a frame according to the present invention.

With reference to FIG. 1, a rectangular frame bottom panel 1 is blanked off flat ferrous sheet metal, preferably 1 mm thick.

Also by blanking, or punching, the panel is provided with openings, such as 2, and rivet eyelets, such as 3, which may conveniently be of two types, namely round for registered joints, and slotted for joints which require takeup of processing tolerances.

Also formed are four openings 4, 5, 6, 7 for passing through four feet or rests for the frame, of which three 8, 9 and 10 are shown.

The rests or feet may be all identical or different types.

The feet 8, 10 consist, for example, of a supporting saddle having a wheel 17, 18 journalled therein respectively to permit of easy movement across the supporting surface in at least one direction, if required, after raising one end of the frame.

The rest 9 may be, for example, a simple rigid member, formed from sheet metal bent to provide a box-type body, for example.

All the rests 8, 9 and 10 are provided with openings for attachment to the frame using rivets, or screws where detachability is of interest.

The bottom panel 1 is turned up at the edges to form a rectangular rim comprising sides 11, 12, 13, 14.

The sides 13, 14 corresponding to the longer sides of the panel 1 are further turned outwards parallel with the panel 1 into two rest wings 15, 16 for receiving side panels fixedly thereon.

The sides 11, 12 have their ends bent over the sides 13, 14 and riveted to the latter.

The resultant rim formation imparts stiffness and undeformability to the bottom panel.

Further stiffening, effective to prevent warping, is provided by two metal panels 19, 20, each bent to form a stiffening crosspiece which extends between the opposed long sides 13, 14 of the rim.

The crosspieces are each comprised of an upper supporting plate 21, 22, respectively, to which the rests or feet 8, 9, 10 are attached, sided by Z-shaped ribbings 23, 24, 25, 26 which are turned downwards and riveted to the bottom panel 1.

The ends of the crosspieces extend beyond the side ribbings and overlap the rim wings 15, 16, to which they are attached by means of rivets.

The crosspiece ends have their edges bent vertically to form vertical supports 27, 28, 29, 30 for vertical walls of the frame.

The side ribbings 23, 24, 25, 26 of the crosspieces are provided with corner webs 31, 32, 33, 34, 35, 36, 37, 38, formed by bending and being in turn provided with flanges for rivet joining to the wings 15 and 16, respectively, of the rim and to the vertical walls of the frame.

The numerals 29, 40 identify two of these flanges.

The crosspieces so joined to the bottom panel form box-type elements which provide support for the side panels by effectively acting as an interfit joint of adequate stiffness and flexure.

Concurrently therewith, the upper plate 21, 22 of the crosspieces acts as a leaf spring supporting the feet 8, 9, 10, whereby the frame is effectively isolated from any transient loads transferred through the rests or feet 8, 9, 10.

The rim sides of the bottom panel 1 are provided with openings 2 all along their spread to admit a ventilation stream into the frame from below.

Similar openings are provided in the upper plate 21, 22 of the stiffening crosspieces to direct a portion of the ventilation stream through the box-type bodies.

Figure 2:
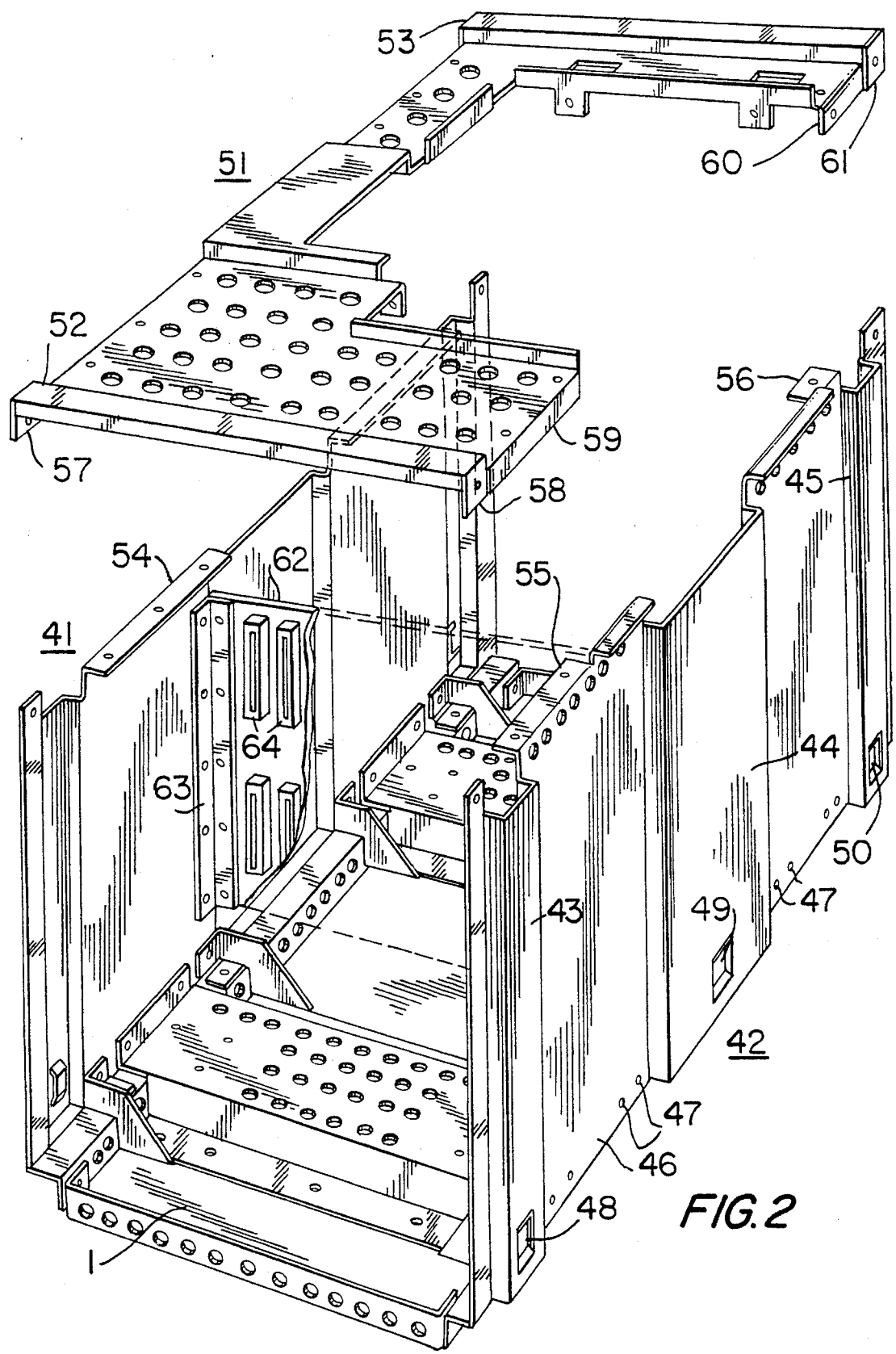
FIG. 2 is a partly exploded perspective view of the whole mechanical structure in a preferred embodiment of the frame according to the invention.

FIG. 2 shows the whole frame in partly exploded perspective view.

Riveted to the bottom panel 1 are two upright side panels 41, 42.

The side panels are each formed of a zinc plated metal plate suitably bent to form vertical jut-out stiffening ribbings 43, 44, 45 which provide flexural stiffness for the panels in a plane perpendicular to the panel and extending in the direction of the ribbings.

The lower edge 46 of the panels is attached, at the portions flush from the ribbings, by rivets 47 to the vertical supports of the bottom structure.

This joint imparts flexural stiffness to the vertical panels in the perpendicular plane to the panel and its ribbings.

Figure 3:
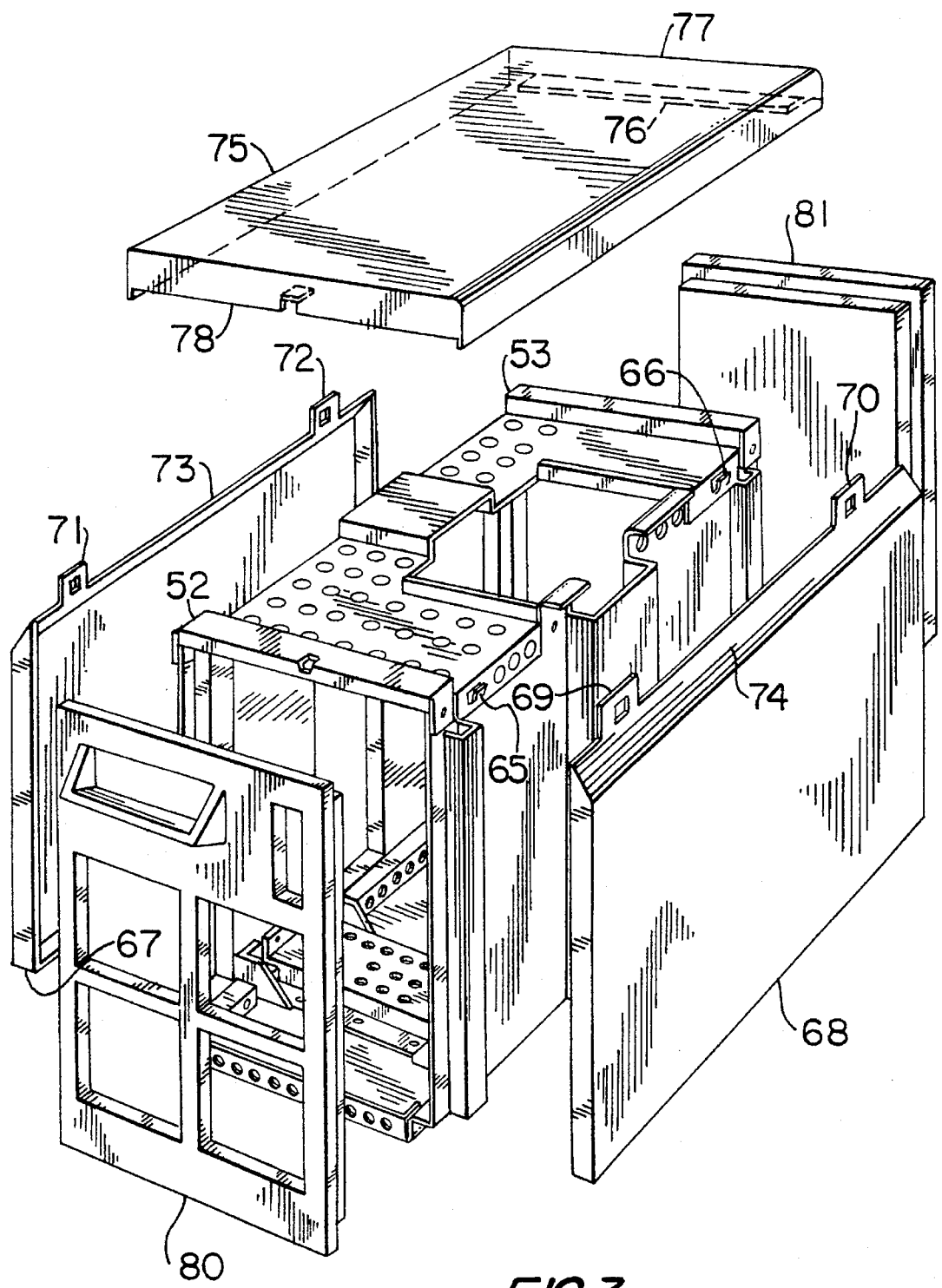
FIG. 3 is an exploded perspective view showing the frame of FIG. 2 complete with outer backing panels.

The outline of the pull-fast type of rivets is contained within the height of the ribbings 43, 44, 45, which ribbings have, therefore, a flat supporting surface for backing outer panels, shown in FIG. 3.

Figure 5:
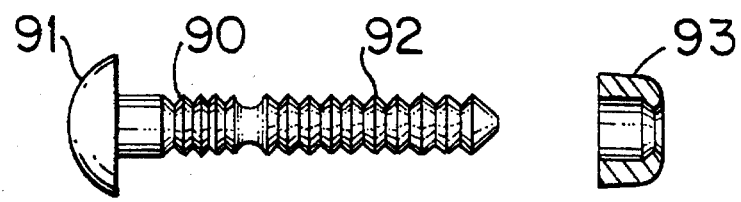
FIG. 5 is an exploded view of a pull-fast rivet used to assemble the frame of this invention.

FIG. 5 is an exploded view of a type of rivet used of preference to produce the various riveted joints.

The rivet has a shank 90 formed with annular grooves and terminated with a head 91 on one end and a pull tail 92 on the other end.

The rivet tail is also formed with annular grooves for gripping by riveting pliers.

After inserting a rivet through an opening in a plate pair to be joined, a clamping sleeve 93 is fitted over the rivet shank.

Riveting pliers, preferably air- or oil-operated, firmly grips the tail with one nose and push the sleeve 93 toward the head 91.

The sleeve is deformed plastically by the pliers, and becomes permanently engaged in the annular grooves of the rivet shank.

The rivet shank 90 and tail 92 are connected to each other by a land having a predetermined cross-sectional area which is smaller than that of the shank and the tail, so that the riveting operation will result in the tail being pulled off the shank, while ensuring that the rivet is not tension strained beyond a predetermined limit.

Thus, the members can be joined fixedly together in a quick and controlled manner.

Also with reference to FIG. 2, openings are advantageously cut by blanking through the lower portion of the ribbings 43, 44, 45 for housing hooking teeth on the backing panels therein, or preferably slightly recessed surfaces (48, 49, 50) to carry adhesive webs of a synthetic fabric co-operating with corresponding webs attached to the backing panels.

The frame construction is completed with a top panel 51, also comprised of a zinc plated metal plate, which is suitably bent to provide stiffening ribbings.

In particular, the panel 51 is provided with two end ribbings 53, 52 extending between the side panels, as well as with intermediate ribbings.

The joint of the side walls 41, 42 to the top panel is obtained by fitting the panel 51 to corner flanges 54, 55, 56 provided on the upper edge of the side panels 41, 42, and simultaneously fitting down-bent corner flanges 57, 58, 59, 60, 61 provided on the panel 51 to the upper edges of the side panels.

The joint is set by means of rivets arranged to act on both flange types and produce an angle connection with doubled resisting section and quadrupled resisting modulus.

The top panel 51 functions to stiffen the frame top while providing for easy access from above to the apparatus accommodated therein.

For this purpose, the panel 51 is provided with a broad window opened as far as the side panel 42.

The frame thus obtained allows electronic components, as carried on suitable sliders with guide rails attached to the frame interior and not shown, to be inserted and removed either through the front or the rear or the top opening.

Advantageously, a printed circuit interconnection support or back panel 62, shown in broken lines, is mounted on the frame at an intermediate location to the two side panels.

The back panel 62 is fastened to two angle pieces of which one, 63, is shown in FIG. 2 and which are respectively secured on the panel 41 and the panel 42 by means of rivets or screws.

The back panel 62 is provided with a plurality of connection sockets 64 for coupling with connectors of electronic boards, or more generally electronic apparatus, which are arranged on either sides of the back panel.

The back panel 62 functions not only to allow a number of apparatus to be interconnected electrically, but also to stiffen the frame in the transverse direction.

All the panels which make up the frame can be easily formed from zinc plated sheet metal, e.g. 1 mm thick, which is subjected, following the blanking and bending steps, to a zinc plating bath for protecting the blanked surfaces and rounding off the blanked edges, thereby making deburring steps unnecessary.

The zinc plating treatment can be carried out on the individual panels in reduced size vats at a high rate, and the finished panels can be stored into packages of minimal bulk.

The frame assembly only involves riveting and screw fastening operations for the accessories, and can be completed within a very short time and in a limited working area for delivery in a ready state to electronics assembling and final testing stations.

The important advantages to be secured in terms of production rate and parts handling are self-evident.

From the electrical standpoint, the frame effectively forms a Faraday cage wherein the riveted joints and zinc plated mating surfaces ensure excellent electric conduction between the various parts and their unipotential bond.

Also, the whole frame is fully protected against corrosion and oxidation in an effective way.

From the mechanical standpoint, the resultant structure is particularly strong and stiff.

Concurrently therewith, the box-type construction of its base, with stiffening and rest feet supporting crosspieces arranged on the upper plate only of the crosspieces, provides a leaf spring support which is particularly effective to dampen accelerations from dropping or improper handling.

For aesthetic reasons, and to further functional advantage, the frame is completed by backing panels as shown in the exploded perspective view of FIG. 3.

The top panel 51 of the frame is provided, on its mounting flanges for the side panels, with hooking and supporting teeth such as 65, 66 for a pair of backing side panels 67, 68, in turn provided with corresponding eyelets 69, 70, 71, 72 co-operating with the hooking teeth.

The backing panels 67, 68 are also formed from zinc plated sheet metal, edge bent to form a stiffening rim with perpendicular sides to the plane of the backing panel, but for the upper side 73 and 74 which is provided with eyelets and inclined at about 40–45° to the panel plane for reasons to be explained.

The outward surface of the backing panels 67, 68 is suitably painted in appropriate colors and baked.

Clearly, the painting and subsequent baking operations can be performed in an easy and safe way on components of simple, essentially flat shape, with the panels lying in a horizontal plane and minimum bulk, which allows the process to be largely automated and carried out at a high production rate by best utilizing the painting area and the volume of furnaces where a plurality of panels arranged parallel with one another can be hung, or laid on horizontal surfaces, with no intereference of the painted parts with holders.

It would also be possible to apply continuous painting and baking processes, on equipment of greatly reduced size.

A cover 75, also of zinc plated sheet metal and painted on its exterior, covers the frame top and rests onto the ribbings of the top panel 51.

The cover 75 is edge bent downwards to provide a stiffening rim having elements for locating the cover on the frame.

These consist of a flange 76, turned in over a side 77 of the rim, which fits between the two side panels of the frame and under an end ribbing 53 of the top panel 51.

Formed by blanking and bending on the opposite side 78 of the cover rim is an inwardly bent tab 79 which fits into a corresponding seat, also blanked off the ribbing 52 of the top panel.

The frame front and rear are covered with panels 80, 81 preferably of a reinforced plastics which are suitably shaped and provided with access openings for accessing control keyboards and/or such electronic apparatus as magnetic recording units and the like.

Both the cover 75 and backing side panels 67, 68 may be provided with felt webs arranged at suitable locations to prevent any vibration from causing metal surfaces to rattle at the rest points of the cover and backing panels on the frame.

In addition, to ensure that the backing panels can lie close against the frame sides, adhesive attachment webs may be provided.

Figure 4:
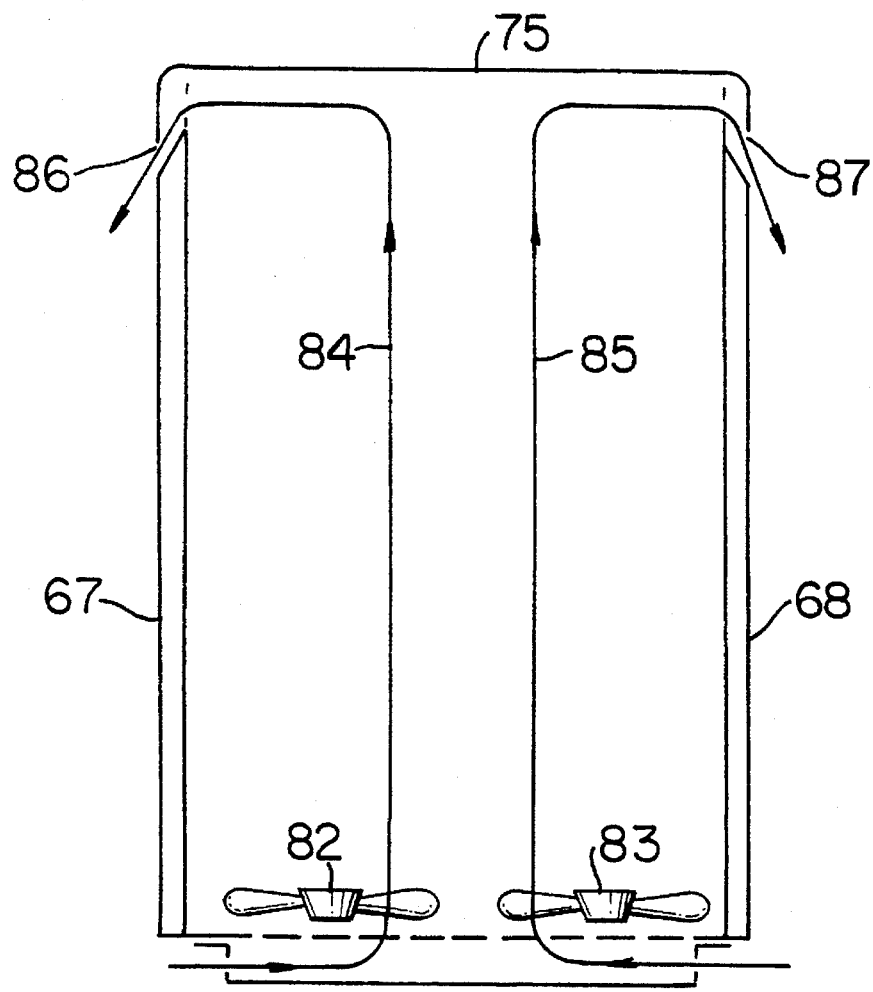
FIG. 4 illustrates schematically the ventilation flow inside the frame.

FIG. 4 shows schematically in cross-section the frame of FIG. 3 and its backing panels to bring out the functional aspect of the backing panels and the cover for the purpose of ventilation.

The lower portion of the frame accommodates a plurality of fans 82, 83 which draw in a stream of air through the openings 2 formed in the rim of the bottom panel and the upper plate of the box-type bodies.

The air stream, as represented by lines 84, 85, sweeps over the electronic apparatus and leaves the frame through openings provided in the upper edge of the side panels and an unobstructed gap 86, 87 between the downward bent edges of the cover 75 and the upper edges 73, 74 of the backing side panels 67, 68, diagonally across the panel surface.

The backing panels 67 and 68 make the frame sides impervious to prevent leakage from the ventilation stream.

The ventilation outflow from the frame is diverted downwards of the cover 75 and will not inconvenience an operator standing near the apparatus.

Further, the absence of exposed openings from the upper face of the cover guards the apparatus against the possibility of foreign matter dropping into the frame by gravity.

It is understood that the foregoing description only covers a preferred embodiment of the invention and that many changes may be made thereunto.

For instance, with reference to FIG. 1, the vertical supports 27, 28, 29, 30 for the side panels may be formed by additional turned-up extensions of the bottom panel wings 15, 16, rather than by the ends of the stiffening crosspieces.

Alternatively, the side panels could be provided, at their lower edges, with turned-in flanges which would rest onto the flanges 15, 16 and be riveted thereto, or the various solutions mentioned above could be combined.

All such alternative embodiments may be referred to as angle joining means for riveting the lower edge of the side panels to the bottom panel.

I claim:

1. A computer frame comprising:
   a bottom panel of metal having a rim formation of rectangular configuration bent upwards from said bottom panel, said rim formation having two wings jutting out parallel with said bottom panel from opposed long sides of said rim;
   a first pair of metal panels, each bent to provide a stiffening crosspiece and running between said opposed long sides having ends which overlap said jut-out wings and riveted to said bottom panel of metal and to said jut-out wings, each crosspiece forming, with said bottom panel, a stiff box-type body having a supporting upper plate parallel with said bottom panel;
   a second pair of vertical side panels of metal lying parallel with each other and having a lower edge and an upper edge and being bent to provide vertical stiffening and spacing ribs which extend outwards;
   angle joining means formed on at least one of said side panels of metal, said crosspiece ends and said jut-out wings to secure, as by riveting, said lower edge of said side panels to said bottom panel;
   a top frame panel of metal extending between said side panels parallel with said bottom panel and having edge portions which are at least bent to provide stiffening ribs extending crosswise between said side panels, and having vertical lips which are bent downwards and overlap said upper edge of said side panels and are riveted to the latter, and
   wherein said bottom panel of metal is provided with four openings, each located near one corner of said rectangular rim configuration of said bottom panel, said frame further comprising a double pair of rest feet, each passed freely through one of said openings and supported on said supporting plate of said stiff box-type body.

2. A frame as in claim 1, wherein at least one pair rests are formed by a pair of supporting wheels, each journalled in a supporting fork attached to said supporting plate.

3. A frame as in claim 1, wherein said top panel of metal has a window to allow for the introduction and removal of electronic components into/from said frame through said window.

4. A frame as in claim 1, wherein said first pair of metal panels has lugs bent to provide stiffening angle ribs which extend between said bottom and said side panels perpendicularly to said bottom and said side panels.

5. A frame as in claim 1, wherein said vertical lips of the top panel have supporting hooks for a pair of outer backing side panels laid detachably against said outer ribs of said side panels.

6. A frame as in claim 5, comprising a rectangular cover of metal overlying and resting on said top frame panel of metal and being provided with a turned-down rim lying perpendicularly and flush with said outer backing side panels and being spaced vertically from the latter to leave a flow-through gap for a ventilation stream.

7. A frame as in claim 1, comprising a pair of angle pieces attached vertically to said side panels at an intermediate location on said side panels, and a back panel carrying connection sockets on either faces and being attached to said angle pieces perpendicularly to said side panels for releasable insertion of electronic boards in said connectors through a from opening and a rear opening, respectively, of said frame.

* * * * *